United States Patent [19]

Miyamoto

[11] Patent Number: 5,696,731
[45] Date of Patent: Dec. 9, 1997

[54] SEMICONDUCTOR MEMORY DEVICE USING INTERNAL VOLTAGE OBTAINED BY BOOSTING SUPPLY VOLTAGE

[75] Inventor: Junichi Miyamoto, Yokohama, Japan

[73] Assignee: Kabushiki Kaisha Toshiba, Kawasaki, Japan

[21] Appl. No.: 708,951

[22] Filed: Sep. 6, 1996

Related U.S. Application Data

[63] Continuation of Ser. No. 417,888, Apr. 6, 1995, Pat. No. 5,612,924.

[30] Foreign Application Priority Data

Apr. 8, 1994 [JP] Japan ................... 6-070554

[51] Int. Cl.$^6$ ................... G11C 8/00
[52] U.S. Cl. ................ 365/233.5; 365/203; 365/230.06
[58] Field of Search ................ 365/233.5, 203, 365/230.06

[56] References Cited

U.S. PATENT DOCUMENTS

| | | |
|---|---|---|
| 4,272,832 | 6/1981 | Ito ................ 365/233.5 |
| 5,272,042 | 12/1993 | Ichiguchi ................ 365/203 |
| 5,306,963 | 4/1994 | Leak et al. ................ 365/233.5 |
| 5,335,106 | 8/1994 | Kawamoto ................ 365/233.5 |
| 5,493,538 | 2/1996 | Bergman ................ 365/233.5 |

Primary Examiner—David C. Nelms
Assistant Examiner—F. Niranjan
Attorney, Agent, or Firm—Banner & Witcoff, Ltd.

[57] ABSTRACT

A main booster circuit generates an internal supply voltage obtained by boosting a supply voltage. A detector detects a skew in an address signal. An oscillator generates a pulse signal while the detector is detecting the skew in the address signal. An auxiliary booster circuit generates an internal supply voltage in accordance with the pulse signal from the oscillator. A row decoder selects one of a plurality of word lines in accordance with the address signal. A word line driver drives the word line selected by the row decoder, based on the internal supply voltages supplied from the main booster circuit and the auxiliary booster circuit.

5 Claims, 4 Drawing Sheets

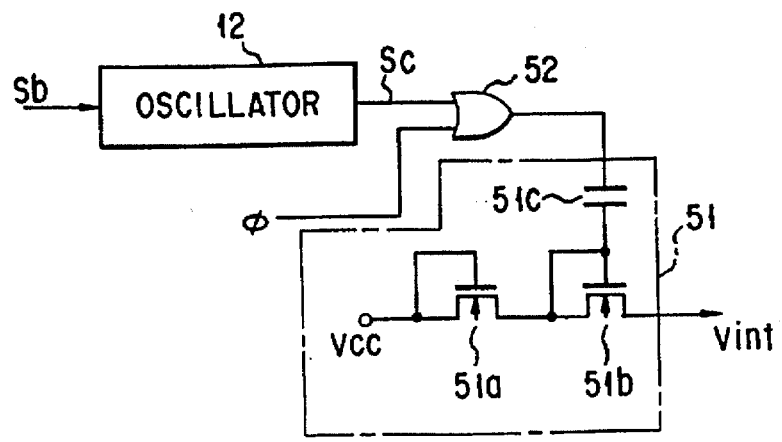
F I G. 5

SEMICONDUCTOR MEMORY DEVICE USING INTERNAL VOLTAGE OBTAINED BY BOOSTING SUPPLY VOLTAGE

This application is a continuation of application Ser. No. 08/417,888, filed Apr. 6, 1995 Pat. No. 5,612,924.

BACKGROUND OF THE INVENTION

1. Field of the Invention

The present invention relates to an asynchronous semiconductor memory device like a flash memory, and, more particularly, to a semiconductor memory device which uses an internal voltage obtained by boosting the supply voltage.

2. Description of the Related Art

FIG. 6 illustrates a read circuit for a NOR type flash memory. A word line WL is connected to the output terminal of a word line driver 61, and the control gate of a memory cell MC constituted of an EEPROM (Electrically Erasable Programmable Read Only Memory) is connected to this word line WL. A power supply SW for the word line driver 61 is set to a high potential Vpp at the time of programming the EEPROM, and is set to Vcc when reading data therefrom. At the time of data reading, non-selected word lines are set to 0 V while the selected word line is set to Vcc. Of the selected cells, the cells from which data has been erased and whose threshold voltages are equal to or less than Vcc are turned on, so that data "1" is read out. Meanwhile, the cells in which data has been written and whose threshold voltages are equal to or greater than Vcc are turned off, allowing data "0" to be read out. Particularly, as the difference $V_M$ between the maximum value of the threshold value distribution and the supply voltage Vcc increases, a greater current can flow through the data-erased cells as shown in FIG. 7. This can improve the reading speed.

To reduce the consumed power of a microprocessor and the like, the supply voltage is recently apt to be reduced to 3.3 V±0.3 V from 5 V±0.5 V. To reduce the supply voltage in the circuit structure shown in FIG. 6 while ensuring the satisfactory performance, however, the distribution of the threshold voltage shown in FIG. 7 should be narrowed. As the distribution of the threshold voltage depends on a variation in the process, such as the shape of the memory cells or the impurity density, it is not easy to narrow the distribution of the threshold voltage. In this respect, word line driving systems as exemplified in FIGS. 8 and 9 have been proposed in place of the system in FIG. 6 which directly provide the supply voltage Vcc to the word lines.

The system shown in FIG. 8 drives the word lines, when selected, based on a boosted supply voltage Vcc, while the system in FIG. 9 uses as the internal supply voltage a boosted voltage Vint always produced from the supply voltage Vcc by a booster circuit 91.

In the circuit shown in FIG. 8, the potentials on word lines are boosted as follows. First, for the selected word line, a reset signal Reset and a boost signal Boot are set to a low level, and a select signal Sel is set to a high level. Then, the potential $V_{WL}$ of the word line WL is precharged to $$V_{WL} = Vcc - Vthn \quad (1)$$

where Vthn is the threshold voltage of an N channel MOSFET. Thereafter, when the boost signal Boot is set to a high level, the potential $V_{WL}$ of the word line WL is boosted to $$V_{WL} = Vcc(1 + (C_{WL}/Cboot)) - Vthn \quad (2)$$

where $C_{WL}$ is the capacitance of the word line and Cboot is the capacitance of the boosting capacitor. To change the word line from this state to the non-selected state, the select signal Sel should be set to a low level while setting the reset signal Reset to a high level.

To increase the potential $V_{WL}$ on the word line WL, this method requires the following condition as apparent from an equation (2).

$$Cboot \gg C_{WL}$$

That is, it is necessary to provide a boosting capacitor whose capacitance is equal to or greater than the capacitance of the word line. Even in the case where the capacitance of the word line is reduced by separating the memory cells into groups of memory cells, for example, a boosting capacitor having a capacitance greater by several factors than the capacitance of the word line should be formed in the chip, significantly increasing the occupying area in the chip.

In the circuit shown in FIG. 9, the voltage boosted by the booster circuit 91 is accumulated in a capacitor 92. Since the capacitance of this capacitor 92 need not be greater than the capacitance of the entire word lines, this circuit occupies a less area than the circuit shown in FIG. 8. As shown in FIG. 10, however, an asynchronous memory like the ordinary flash memory allows for a skew time Tskew or the unsettled time from the change in the first address signal $A_{RO}$ to the change in the last address signal $A_{Rn}$ and to the settlement of the true select address signal. This means that the access time Tacc from the settlement of the last address signal $A_{Rn}$ to the point of data output should be determined regardless of the length of the skew time Tskew. It is however known that in the internal operation of the memory, some word line is always selected in the skew time Tskew and when the word line driver is constituted of a CMOS inverter, the through current flows at the time of the transition of the logic level. With the circuit structure shown in FIG. 9, therefore, the through current seems to always flow during the skew time Tskew. If the skew time is long, the internal voltage Vint may drop and the operation speed may fall as a consequence, and in the worst case cause.

As a solution to the above shortcoming, the capacitance of the capacitor 92 may be increased to provide a longer allowable skew time. But, the capacitance of the capacitor 92 is limited and it is not possible to match the increased skew time with that permitted by a device with the 5-V supply voltage Vcc or 3.3-V supply voltage Vcc which allows for an unlimited length of skew time from the viewpoint of the specifications. Moreover, this scheme undesirably increases the occupying area of the capacitor 92.

SUMMARY OF THE INVENTION

Accordingly, it is an object of the present invention to provide a semiconductor memory device which can prevent the internal supply voltage from dropping even when the skew in an address signal continues indefinitely, thus suppressing the deterioration of the performance.

The object of this invention is achieved by the following structure.

A semiconductor memory device having a logic gate supplied with an internal voltage obtained by boosting a supply voltage, the logic gate permitting one memory cell to be selected asynchronously in accordance with an address signal, the device comprising:

detection means for detecting a change in the address signal;

generation means for generating a pulse signal of a predetermined frequency while the detection means is detecting a change in the address signal; and booster means for boosting the supply voltage in accordance with the pulse signal output from the generation means to produce the internal voltage and supplying the internal voltage to the logic gate.

According to this invention, while the detection means is detecting a change in the address signal and its output signal is active, the generation means generates a pulse signal of a predetermined frequency and the booster means boosts the supply voltage to generate the internal voltage in accordance with the pulse signal from the generation means. While the address signal is changing, therefore, the internal voltage is produced by the generation means, so that even when the skew in an address signal continues indefinitely, the reduction in the internal supply voltage can be prevented.

Moreover, since the internal voltage is generated by a high-frequency pulse signal, the capacitor can have a smaller capacitance, thus reducing the occupying area of the capacitor in the chip.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a structural diagram showing the essential parts of a fourth embodiment of this invention;

DETAILED DESCRIPTION OF THE PREFERRED EMBODIMENTS

Preferred embodiments of the present invention will now be described .referring to the accompanying drawings.

Figure 1:
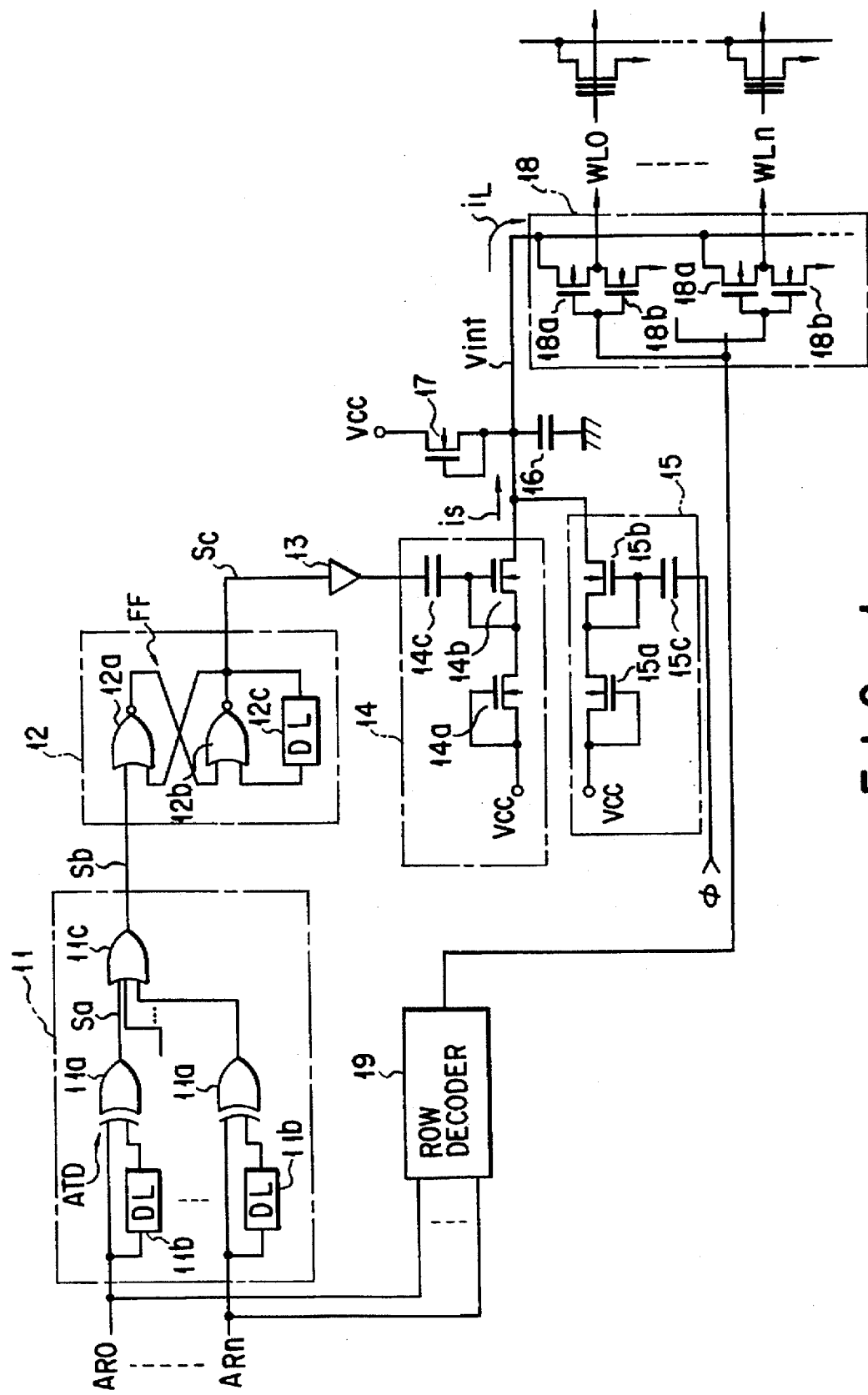
FIG. 1 is a circuit diagram illustrating a first embodiment of this invention.

FIG. 1 illustrates a first embodiment of this invention. Referring to FIG. 1, row address signals $A_{R0}$ to $A_{Rn}$, for example, are supplied to a detector 11 which detects a skew. This detector 11 comprises a plurality of exclusive OR (EXOR) circuits 11a and a plurality of delay circuits (DL) 11b, both constituting an address transition detector (ATD), and an OR circuit 11c to which the output signals of those EXOR circuits 11a are supplied. More specifically, the row address signals $A_{R0}$ to $A_{Rn}$ are respectively supplied to one input ends of the EXOR circuits 11a, and to the other input ends of the EXOR circuits 11a via the respective delay circuits 11b. The output ends of those EXOR circuits 11a are connected to the input end of the OR circuit 11c whose output end is connected to an oscillator 12. This oscillator 12 produces a signal of a predetermined period while the detector 11 outputs a detection signal. The oscillator 12 comprises a flip-flop circuit FF constituted of NOR circuits 12a and 12b, and a delay circuit (DL) 12c. More specifically, the output end of the OR circuit 11c is connected to one input end of the NOR circuit 12a whose other input end is connected to the output end of the NOR circuit 12b. The output end of the NOR circuit 12a is connected to one input end of the NOR circuit 12b. The other input end of the NOR circuit 12b is connected via the delay circuit 12c to the output end of the NOR circuit 12b.

The output signal of the oscillator 12 is connected via a buffer amplifier 13 to an auxiliary booster circuit 14. This auxiliary booster circuit 14 generates an internal supply voltage Vint in accordance with the pulse signal output from the oscillator 12. The auxiliary booster circuit 14 comprises N channel transistors 14a and 14b and a capacitor 14c. The N channel transistor 14a has a gate and a source both supplied with a supply voltage Vcc, and the N channel transistor 14b has a gate and a source connected to the drain of the transistor 14a. The capacitor 14c is connected between the gate of the transistor 14b and the output end of the buffer amplifier 13.

Connected to the output terminal of the auxiliary booster circuit 14 is the output terminal of a main booster circuit 15, which always generates the internal supply voltage Vint in accordance with the pulse signal φ. The main booster circuit 15 comprises N channel transistors 15a and 15b and a capacitor 15c. The N channel transistor 15a has a gate and a source both supplied with the supply voltage Vcc. The N channel transistor 15b has a gate and a source connected to the drain of the transistor 15a. The capacitor 15c has one end connected to the gate of the transistor 15b and the other end supplied with the pulse signal φ. This main booster circuit 15 has a relative low pumping performance, just enough to supplement the leak current, and the pulse signal φ is always supplied to this main booster circuit 15. The period of this pulse signal φ is set to, for example, 100 ns.

A smoothing capacitor 16 is connected between the ground and the output terminals of the main booster circuit 15 and the auxiliary booster circuit 14, and a limiter 17 constituted of an N channel transistor is connected between those output terminals and the power supply Vcc. This limiter 17 serves to prevent the internal supply voltage Vint from rising beyond the supply voltage Vcc. A word line driver 18 is connected to the output terminals of the main booster circuit 15 and the auxiliary booster circuit 14. This word line driver 18 is driven by the output signal of a row decoder 19 which decodes the address signal. More specifically, the word line driver 18 comprises a plurality of P channel transistors 18a and a plurality of N channel transistors 18b, both constituting CMOS inverters. Each P channel transistor 18 has a source connected to the output terminals of the main booster circuit 15 and the auxiliary booster circuit 14. The drains of the individual P channel transistors 18a and N channel transistors 18b are connected to word lines WL0 to WLn, respectively. Also connected to the word lines WL0-WLn are the control gates of EEPROMs, thereby constituting a NOR type flash memory, for example. Further, the sources of the N channel transistors 18b are grounded, and the gates of the P channel transistors 18a and the N channel transistors 18b are connected to the output terminal of the row decoder 19.

Figure 2:
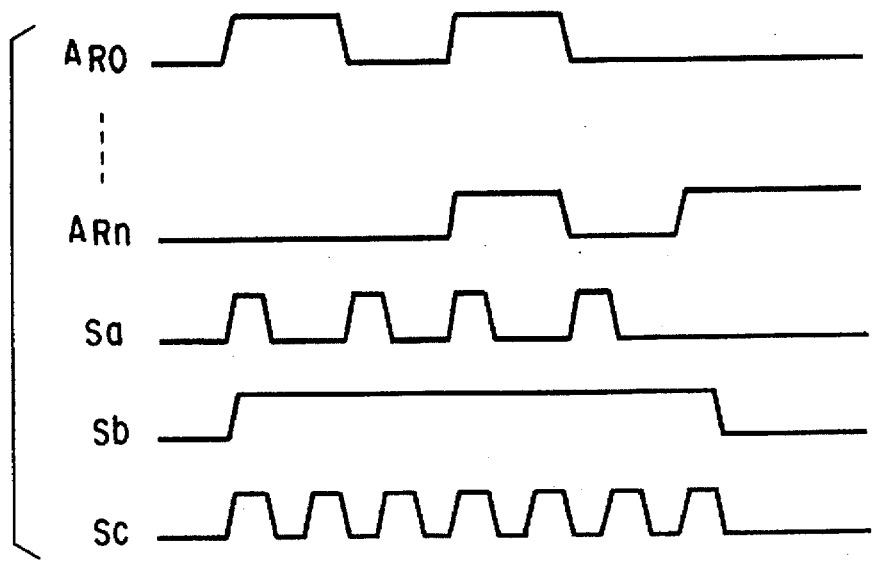
FIG. 2 is a timing chart for explaining the operation of the circuit in FIG. 1.

The operation of the above-described structure will now be described with reference to FIG. 2. When the row address signal $A_{RO}$ changes, the associated EXOR circuit 11a outputs a signal Sa having a pulse width corresponding to the delay time set in the delay circuit 11b. The other EXOR circuits 11a also output the signal Sa in accordance with changes in the associated row address signals, and those signals Sa are supplied to the OR circuit 11c. The OR circuit 11c outputs a signal Sb, resulting from the ORing of the signals Sa. This signal Sb is indicative of the occurrence of a skew in the address signal, and is supplied to the oscillator 12. The output signal of this oscillator 12 becomes a low level when the output signal of the delay circuit 12c becomes a high level, regardless of the level of one input end of the NOR circuit 12a. That is, while the signal Sb remains at the high level, the oscillator 12 produces a pulse signal Sc whose period corresponds to the delay time set in the delay circuit 12c. The period of this pulse signal Sc is set to 2 ns to 5 ns, for example. This pulse signal Sc is supplied via the buffer amplifier 13 to the auxiliary booster circuit 14, which in turn generates the internal supply voltage Vint in accordance with the pulse signal Sc. Since the period of the pulse signal Sc is shorter than that of the pulse signal φ, the pumping performance of the auxiliary booster circuit 14 is set higher than that of the main booster circuit 15. While a skew occurs in the address signal, therefore, the auxiliary booster circuit 14 and the main booster circuit 15 supply the internal supply voltages Vint. Even if a skew in the address signal indefinitely continues., therefore, the internal supply voltage Vint does not change.

In accordance with the row address signals, the row decoder 19 alters the input level of the word line driver 18 to which the internal supply voltage Vint is supplied. At this time, although a through current $i_L$ flows in the word line driver 18, the internal supply voltage Vint does not drop if a current $i_S$ output from the auxiliary booster circuit 14 and main booster circuit 15 and the through current $i_L$ satisfy the relation $i_S \geq i_L$. Even when the current $i_S$ becomes excessive, the limiter 17 operates to prevent the internal supply voltage Vint from changing.

When the row address signals are settled, the signals Sa and Sb both become a low level, the oscillator 12 stops oscillating and the auxiliary booster circuit 14 stops the boosting operation. After the settlement of the address signals, therefore, the internal supply voltage Vint is supplied only from the main booster circuit 15.

According to this embodiment, while a skew in the address signal is detected by the detector 11, the oscillator 12 produces the pulse signal Sc and the auxiliary booster circuit 14 generates the internal supply voltage Vint in accordance with this signal Sc. What is more, the frequency of the pulse signal Sc is higher than that of the pulse signal φ supplied to the main booster circuit 15 and the pumping performance of the auxiliary booster circuit 14 is higher than that of the main booster circuit 15. Even if the skew indefinitely continues, therefore, it is possible to prevent a reduction in internal supply voltage Vint.

Figure 8:
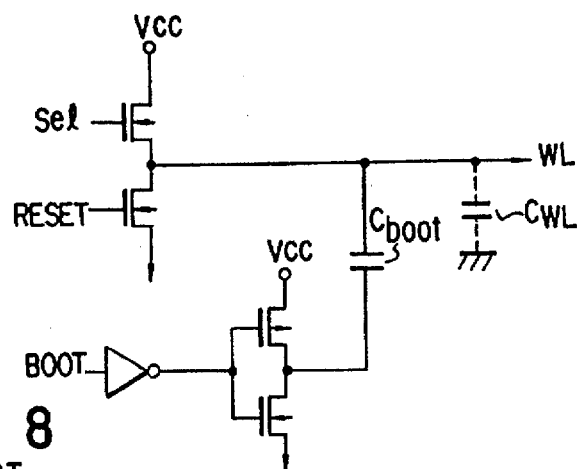
FIG. 8 is a circuit diagram showing one example of a conventional word line driving system.
Figure 9:
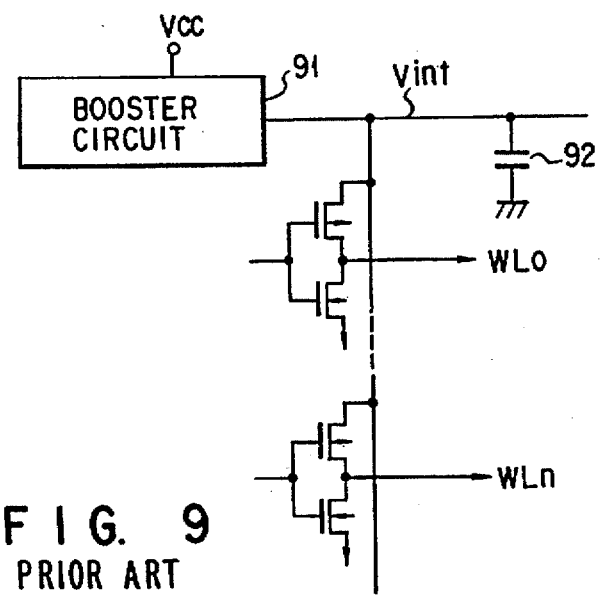
FIG. 9 is a circuit diagram showing another example of the conventional word line driving system.
Figure 10:
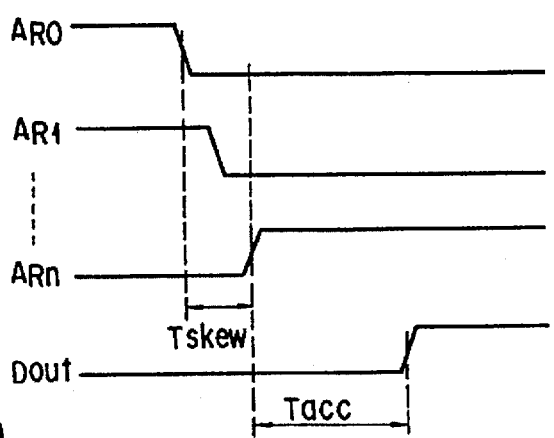
FIG. 10 is a timing chart for explaining the skew in an address signal.

Further, the capacitances of the capacitors 14c and 15c used in the auxiliary booster circuit 14 and the main booster circuit 15 can be set smaller than that of the capacitor Cboot shown in FIG. 8. More specifically, while the capacitor Cboot has a capacitance of about 2000 pF for the case of, for example, a 16M-bit memory cells, the capacitance of the capacitor 14c is about 1 pF, and the capacitance of the capacitor 15c is about 10 pF, for example, with the pulse signal Sc and the internal supply voltage set to the same values as those in the above-described case. It is thus possible to significantly reduce the occupying area of the capacitor as compared with the prior art.

Figure 3:
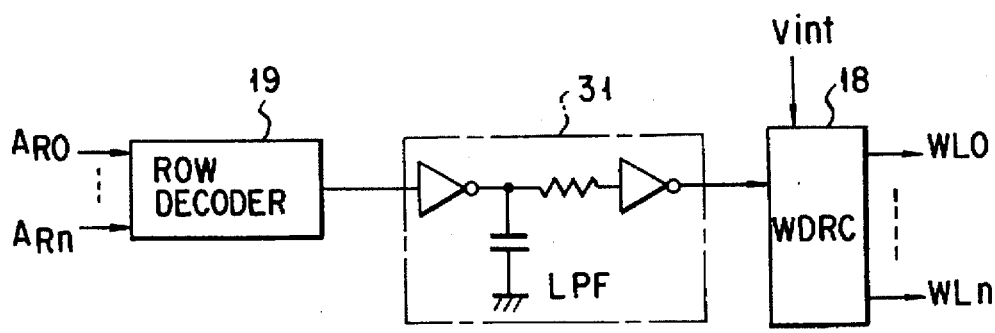
FIG. 3 is a structural diagram showing the essential parts of a second embodiment of this invention.

FIG. 3 illustrates a second embodiment of this invention. Like or same reference numerals as used in FIG. 1 will also be used in FIG. 3 to denote corresponding or identical components. In general, the decoder includes a delay component, serving as a low-pass filter. When the upper limit of the low cutoff frequency of the row decoder 15 is not sufficiently low, the frequency of the flow of the through current $i_L$ to the word line driver 18 increases, so that the supply of the current $i_S$ may not be able to follow up the action. As the low cutoff frequency of the row decoder 15 is not constant in accordance with the manufacturing process, however, some kinds of measure should be taken.

In this embodiment, therefore, a low-pass filter (LPF) 31 with a clearly set low cutoff frequency is inserted between the row decoder 19 and the word line driver (WDRC) 18. The low cutoff frequency fc of this low-pass filter 31 is set to, for example, 200 MHz.

In this embodiment, as the output signal of the row decoder 19 is supplied to the word line driver 18 via the LPF 31 which has a clear low cutoff frequency, the through current can be prevented from flowing to the word line driver 18 without being affected by a variation in the manufacturing process.

If this LPF 31 is constituted by using a delay circuit, the interval of the current supply by the auxiliary booster circuit 4 can be set shorter than the interval of the through current by setting this delay time double or more than double the delay time set in the delay circuit 12c in the oscillator 12. This further prevents the reduction in internal supply voltage Vint.

In the second embodiment, the LPF 31 may be inserted at the previous stage of the row decoder 19 to still obtain the same advantages.

Figure 4:
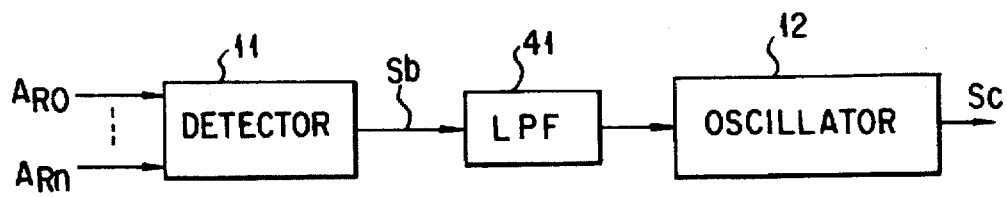
FIG. 4 is a structural diagram showing the essential parts of a third embodiment of this invention.
Figure 6:
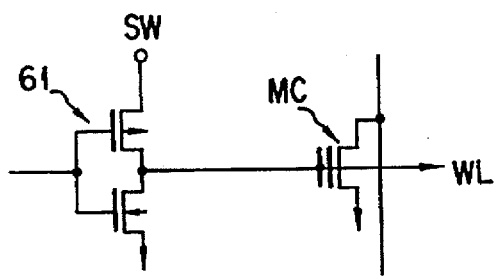
FIG. 6 illustrates a read circuit for a NOR type flash memory.
Figure 7:
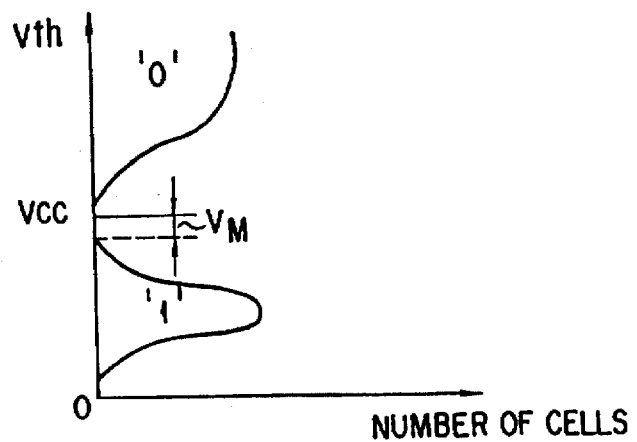
FIG. 7 is a diagram showing the distribution of the threshold voltage of the circuit shown in FIG. 6.

FIG. 4 illustrates a third embodiment of this invention. Like or same reference numerals as used in FIG. 1 will also be used in FIG. 4 to denote corresponding or identical components. The output signal Sa of the detector 11 is produced by ORing the short-width pulse signals Sb output from the EXOR circuits 11a by the OR circuit 11c. The signal Sa may therefore contain a high-frequency component, and the oscillation of the oscillator 12 may become unstable.

In this embodiment, therefore, a LPF 41 with its low cutoff frequency clearly set is inserted between the detector 11 and the oscillator 12. The low cutoff frequency fc of this LPF 41 is set to, for example, about 5 MHz to 10 MHz.

This embodiment can stabilize the oscillation of the oscillator 12, so that the boosting performance of the auxiliary booster circuit 14 is not reduced, thus ensuring the stable generation of the internal supply voltage Vint.

FIG. 5 illustrates a fourth embodiment of this invention. Like or same reference numerals as used in FIG. 1 will also be used in FIG. 5 to denote corresponding or identical components. In the first embodiment, the capacitor 14c constituting the auxiliary booster circuit 14 and the capacitor 15c constituting the main booster circuit 15 have mutually different roles. Since the capacitor 15c is driven by the pulse signal φ of a relatively low frequency, if the capacitor 15c has a large capacitance, if can still be charged sufficiently. By way of contrast, the capacitor 14c can continuously output the current $i_S$ better if it has a faster response to the high frequency. It is therefore desirable that the capacitor 14c has a smaller capacitance than that of the capacitor 15c. If the difference between the oscillation frequency of the oscillator 12 and the frequency of the pulse signal φ is set smaller, however, the difference between the capacitances of the capacitors 14c and 15c can be made smaller so that those capacitors can be shared.

This embodiment is designed in such a manner that the capacitors 14c and 15c are shared and the auxiliary booster circuit 14 and the main booster circuit 15 are realized by a single booster circuit. A booster circuit 51 comprises an N channel transistor 51a having a gate and a source both supplied with the supply voltage Vcc, an N channel transistor 51b having a gate and a source connected to the drain of the transistor 51a, and a capacitor 51c having one end connected to the gate of the transistor 51b. The pulse signal Sc output from the oscillator 12 and the pulse signal φ are supplied via an OR circuit 52 to the other end of the capacitor 51c.

Since this embodiment requires a single booster circuit, the occupying area in the chip can be reduced further.

The asynchronous memory to which this invention is applied is not limited to the NOR type flash memory, but this invention may well be adapted for a static RAM, for example.

What is claimed is:

1. A semiconductor memory device having a logic gate supplied with an internal SUPPLY voltage obtained by boosting a SUPPLY voltage, said logic gate permitting one memory cell to be selected asynchronously in accordance with an address signal, said device comprising:

detection means for detecting a change in said address signal;

generation means for generating a pulse signal of a predetermined frequency comprising a plurality of pulses while said detection means detects a change in said address signal; and booster means for boosting said SUPPLY voltage in accordance with said pulse signal output from said generation means to produce said internal SUPPLY voltage and supplying said internal voltage to said logic gate.

2. A device according to claim 1, further comprising a low-pass filter, connected to an input end of said logic gate for said address signal, for cutting off a high-frequency component included in said address signal.

3. A device according to claim 1, further comprising a low-pass filter, connected between said detection means and said generation means, for cutting off a high-frequency component generated from said detection means in accordance with a change in said address signal.

4. A device according to claim 1, wherein said generation means comprises:

a first logic gate having first and second input ends and an output end, with an output signal of said detection means being supplied to said first input end of said first logic gate;

a second logic gate having a first input end connected to said output end of said first logic gate, a second input end, and an output end connected to said second input end of said first logic gate; and a delay circuit connected between said output end and said second input end of said second logic gate.

5. A semiconductor memory device having a logic gate supplied with an internal SUPPLY voltage obtained by boosting a SUPPLY voltage, said logic gate permitting one memory cell to be selected asynchronously in accordance with an address signal, said device comprising:

detection means for detecting a change in said address signal;

generation means for generating a pulse signal of a predetermined frequency comprising a plurality of pulses while said detection means detects a change in said address signal; and booster means having a capacitor, for charging said SUPPLY voltage in accordance with said pulse signal output from said generation means to produce said internal SUPPLY voltage and supplying said internal voltage to said logic gate.

* * * * *